(12) United States Patent  
Yamashiro et al.

(10) Patent No.: US 8,273,506 B2
(45) Date of Patent: Sep. 25, 2012

(54) METHOD OF MANUFACTURING OPTICAL ELEMENT, AND OPTICAL ELEMENT

(75) Inventors: Kazuhide Yamashiro, Shinjuku-ku (JP); Hideki Suda, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 115 days.

(21) Appl. No.: 12/718,655

(22) Filed: Mar. 5, 2010

(65) Prior Publication Data

US 2011/0151383 A1    Jun. 23, 2011

(30) Foreign Application Priority Data

Dec. 21, 2009    (JP) ................................. 2009-289010

(51) Int. Cl.
  *G03F 1/30* (2012.01)
(52) U.S. Cl. ............................................ 430/5; 430/394
(58) Field of Classification Search ............... 430/5, 30, 430/322, 323, 324, 394
  See application file for complete search history.

(56) References Cited

U.S. PATENT DOCUMENTS 6,576,374 B1*  6/2003  Kim .................................... 430/5
2007/0190434 A1*  8/2007  Suda ................................. 430/5

FOREIGN PATENT DOCUMENTS

| JP | 2003-330159 A | 11/2003 |
| JP | 2004029747 A | 1/2004 |
| JP | 2005062571 A | 3/2005 |

OTHER PUBLICATIONS

Korean Office Action corresponding to Korean Patent Application No. 9-5-2011-028319270, issued May 26, 2011, English language translation.

* cited by examiner

*Primary Examiner* — Stephen Rosasco

(74) *Attorney, Agent, or Firm* — Sughrue Mion, PLLC

(57) ABSTRACT

A manufacturing method of an optical element is provided, the optical element comprising: a shield part formed by a light shielding film formed and patterned on a substrate; a light transmission part formed by partially exposing a surface of the substrate; and a phase shifter part formed by partially etching the surface of the substrate, the method comprising the steps of: preparing an optical element blank with the light shielding film and a first resist film laminated on the substrate in this order; and forming a first resist pattern by applying drawing and development to the first resist film, covering a formation scheduled area of the shield part, and demarcating the formation scheduled area of the phase shifter part.

8 Claims, 5 Drawing Sheets

Prior Art

Prior Art

METHOD OF MANUFACTURING OPTICAL ELEMENT, AND OPTICAL ELEMENT

BACKGROUND

1. Technical Field

The present invention relates to an optical element such as a transparent-type phase shifting mask in which a transfer pattern having a shield part, a light transmission part, and a phase shifter part is formed on a substrate, and relates to a manufacturing method of the same.

2. Description of Related Art

In recent years, an optical element such as a transparent-type phase shifting mask in which a transfer pattern having a shield part, a light transmission part, and a phase shifter part is formed on a substrate (for example, a transparent substrate such as quartz), is known (for example, see patent document 1). The shield part is formed by patterning a light shielding film formed on the substrate, so that light emitted to the optical element is blocked. The light transmission part is formed by partially exposing the surface of the substrate, so that the light emitted to the optical element is transmitted therethrough. The phase shifter part is formed by partially etching the exposed surface of the substrate, so that the light emitted to the optical element is transmitted therethrough while the phase of the light emitted to the optical element is shifted by a prescribed amount.

(Patent document 1) Japanese Patent Laid Open Publication No. 2003-330159

For example, a method shown in FIG. 1 is considered as a method of manufacturing the optical element.

First, an optical element blank 100b is prepared, with a light shielding film 102 and a first resist film 103 formed in this order on a substrate 101 (FIG. 1A). Then, by using a photolithography technique, a first resist pattern 103p covering an area excluding a formation scheduled area 110' of a phase shifter part 110 (a formation scheduled area 111' of a light transmission part 111 and a formation scheduled area 120' of a shield part 120) is formed (FIG. 1B). Then, a partially exposed light shielding film 102 is etched and removed, with the formed first resist pattern 103p as a mask, and thereafter the surface of the substrate 101 partially exposed by etching the light shielding film 102 is etched by a prescribed depth, to thereby form the phase shifter part 110 (FIG. 1C). Then, the first resist pattern 103p is removed (FIG. 1D). Then, a second resist film 104 is formed so as to cover entire surfaces of the formation scheduled area 111' of the light transmission part 111, the formation scheduled area 120' of the shield part 120, and the phase shifter part 110 (FIG. 1E). Then, by using the photolithography technique, a second resist pattern 104p covering a formation scheduled area 120' of the shield part 120 is formed (FIG. 1F). Then, the exposed light shielding film 102 is etched and removed, with the second resist pattern 104p as a mask, and the surface of the substrate 101 is partially exposed, to thereby form the light transmission part 111 (FIG. 1G). Then, the second resist pattern 104p is removed (FIG. 1H). Thus, the optical element 100 is manufactured, with the shield part 120, the light transmission part 111, and the phase shifter part 110 formed on the substrate 101.

Further, a method shown in FIG. 2, for example, is considered as other method of manufacturing the optical element.

First, an optical element blank 200b is prepared, with a light shielding film 202 and a first resist film 203 formed on a substrate 201 in this order (FIG. 2A). Then, by using the photolithography technique, a first resist pattern 203p covering a formation scheduled area 220' of the shield part is formed (FIG. 2B). Then, the exposed light shielding film 202 is removed by etching, with the formed first resist pattern 203p as a mask (FIG. 2C). Then, the first resist pattern 203p is removed, and a shield part 220 is formed (FIG. 2D). Then, a second resist film 204 is formed so as to cover entire surfaces of the formation scheduled area 211' of the light transmission part, the shield part 220, and formation scheduled area 210' of the phase shifter part (FIG. 2E). Then, by using the photolithography technique, a second resist pattern 204p covering an area excluding the formation scheduled area 210' of the phase shifter part 210 (the formation scheduled area 211' of the light transmission part 211 and the shield part 220) is formed (FIG. 2F). Then, the surface of the exposed substrate 201 is etched by a prescribed depth, with the formed second resist pattern 204p as a mask, to thereby form the phase shifter part 210 (FIG. 2G). Then, the second resist pattern 204p is removed (FIG. 2H). Thus, an optical element 200 is manufactured, with the shield part 220, the light transmission part 211, and the phase shifter part 210 formed on the substrate 201.

In the aforementioned two methods, in each case, the shield part, the light transmission part, and the phase shifter part are demarcated by undergoing a photolithography step twice. For example, in a method shown in FIG. 1, the phase shifter part 110 is demarcated by undergoing a first photolithography step (step shown in FIG. 1B), and thereafter, a border between the shield part 120 and the light transmission part 111 is demarcated by undergoing second photolithography steps (steps shown in FIG. 1F). Further, in a method shown in FIG. 2, the shield part 220 is demarcated by undergoing the first photolithography step (step shown in FIG. 2B), and thereafter the border between the phase shifter part 210 and the light transmission part 211 is demarcated by undergoing the second photolithography step (step shown in FIG. 2F).

However, after a strenuous examination by inventors of the present invention, it is found that for example a relative position between the shield part and the phase shifter part is unintentionally shifted in some cases, when the shield part, the light transmission part, and the phase shifter part are respectively formed by undergoing the photolithography steps twice. Namely, in the aforementioned method, the step of removing a mask blank during processing, from a drawing apparatus once and forming the second resist film (for example, the step shown in FIG. 1E and FIG. 2E) needs to be executed, between the first photolithography step and the second photolithography step.

However, when the mask blank during processing is removed from the drawing apparatus once, an optical element blank is hardly installed on the drawing apparatus with good reproducibility. As a result, deviation of alignment can not be completely prevented from generating between a drawing result in the first photolithography step and a drawing result in the second photolithography step. Namely, when a positional deviation is generated in the mask blank re-installed on the drawing apparatus, in the method shown in FIG. 1, the relative position between the shield part 120 demarcated by the first photolithography step and the phase shifter part 110 demarcated by the second photolithography step (position of C with respect to A, B in FIG. 5B) is deviated by about 10 to 30 nm with respect to the relative position in design. Similarly, in the method shown in FIG. 2 as well, the relative position between the shield part 220 demarcated by the first photolithography step and the phase shifter part 210 demarcated by the second photolithography step (positions of A, B with respect to C in FIG. 5C) is deviated by about 10 to 30 nm with respect to the relative position in design.

SUMMARY OF THE INVENTION

Therefore, an object of the present invention is to provide a manufacturing method of an optical element capable of accurately demarcating a shield part, a light transmission part, and a phase shifter part, and an optical element.

A first aspect of the present invention is a manufacturing method of an optical element, the optical element comprising:

a shield part formed by a light shielding film formed and patterned on a substrate;

a light transmission part formed by partially exposing a surface of the substrate; and a phase shifter part formed by partially etching the surface of the substrate, the phase shifter part having a portion adjacent to the light transmission part, the method comprising the steps of:

preparing an optical element blank with the light shielding film and a first resist film laminated on the substrate in this order; and forming a first resist pattern by applying drawing and development to the first resist film, covering a formation scheduled area of the shield part, and demarcating the formation scheduled area of the phase shifter part.

A second aspect of the present invention is a manufacturing method of an optical element, the optical element comprising:

a shield part formed by a light shielding film formed and patterned on a substrate;

a light transmission part formed by partially exposing a surface of the substrate; and a phase shifter part formed by partially etching the surface of the substrate, the method comprising the steps of:

preparing an optical element blank with the light shielding film and a first resist film laminated on the substrate in this order;

forming a first resist pattern by applying drawing and development to the first resist film, covering a formation scheduled area of the shield part, and demarcating the formation scheduled area of the phase shifter part;

forming the shield part by partially etching the light shielding film with the first resist pattern as a mask, and forming a demarcating pattern for demarcating a formation scheduled area of the phase shifter part;

forming a second resist film covering at least an exposed surface of the substrate;

forming a second resist pattern by applying drawing and development to the second resist film and exposing at least a formation scheduled area of the phase shifter part;

forming the phase shifter part by etching the exposed surface of the substrate with the demarcating pattern and the second resist pattern as masks; and forming the light transmission part by partially exposing the substrate by removing the second resist pattern and the demarcating pattern.

A third aspect of the present invention is the manufacturing method of the optical element according to the second aspect, wherein the light transmission part has a portion adjacent to the phase shifter part.

A fourth aspect of the present invention is the manufacturing method of the optical element according any one of the first to third aspects, wherein a formation scheduled area of the phase shifter part is demarcated by covering an outer peripheral side of the formation scheduled area of the phase shifter part.

A fifth aspect of the present invention is the manufacturing method of the optical element according any one of the first to fourth aspects, wherein in the step of forming the second resist pattern, the substrate is exposed by using pattern data having a dimension obtained by adding an alignment margin to a dimension of the formation scheduled area of the phase shifter part, and in the step of forming the shifter part, the exposed surface of the substrate is etched, with an edge on the side of the formation scheduled area of the phase shifter part in the demarcating pattern and the second resist pattern as masks.

A sixth aspect of the present invention is the manufacturing method of the optical element according to any one of the first to fifth aspects, wherein the substrate is a transparent base material made of quartz.

A seventh aspect is the manufacturing method of the optical element according to any one of the first to fifth aspects, wherein the substrate includes a transparent base material and a phase shifter film formed on the transparent base material, and in the step of forming the phase shifter part, an exposed surface of the phase shifter film is etched, with the demarcating pattern and the second resist pattern as masks.

An eighth aspect is the manufacturing method of the optical element according to any one of the first to seventh aspects, wherein a difference between a phase of transmitted light in the light transmission part and a phase of transmitted light in the phase shifter part is 45 degrees or more and 200 degrees or less.

A ninth aspect of the present invention is the manufacturing method of the optical element according to any one of the first to eighth aspects, wherein a relative position between the light transmission part and the phase shifter part is within ±5 nm with respect to a relative position in design.

A tenth aspect of the present invention is an optical element, comprising:

a shield part formed by a light shielding film formed and patterned on a substrate;

a light transmission part formed by partially exposing a surface of the substrate; and a phase shifter part formed by partially etching the surface of the substrate, the phase shifter part having a portion adjacent to the light transmission part, and the shield part and the phase shifter part are simultaneously demarcated by the step of patterning the light shielding film.

An eleventh aspect of the present invention is the optical element according to the tenth aspect, wherein the substrate includes a transparent base material and a phase shifter film formed on the transparent base material, so that the light transmission part is formed by partially exposing the surface of the phase shifter film, and the phase shifter part is formed by partially etching at least the surface of the phase shifter film.

A twelfth aspect of the present invention is the optical element according to the tenth or the eleventh aspect, wherein a phase difference between transmitted light in the light transmission part and transmitted light in the phase shifter part is 45 degrees or more and 200 degrees or less.

A thirteenth aspect of the present invention is the optical element according to any one of the tenth to twelfth aspects, wherein a relative position between the light transmission part and the phase shifter part is within ±5 nm with respect to a relative position in design.

According to the present invention, a manufacturing method of an optical element and an optical element can be provided, which are capable of accurately demarcating a shield part, a light transmission part, and a phase shifter part.

DESCRIPTION OF PREFERRED
EMBODIMENTS OF THE INVENTION

<An Embodiment of the Present Invention>

Figure 3:
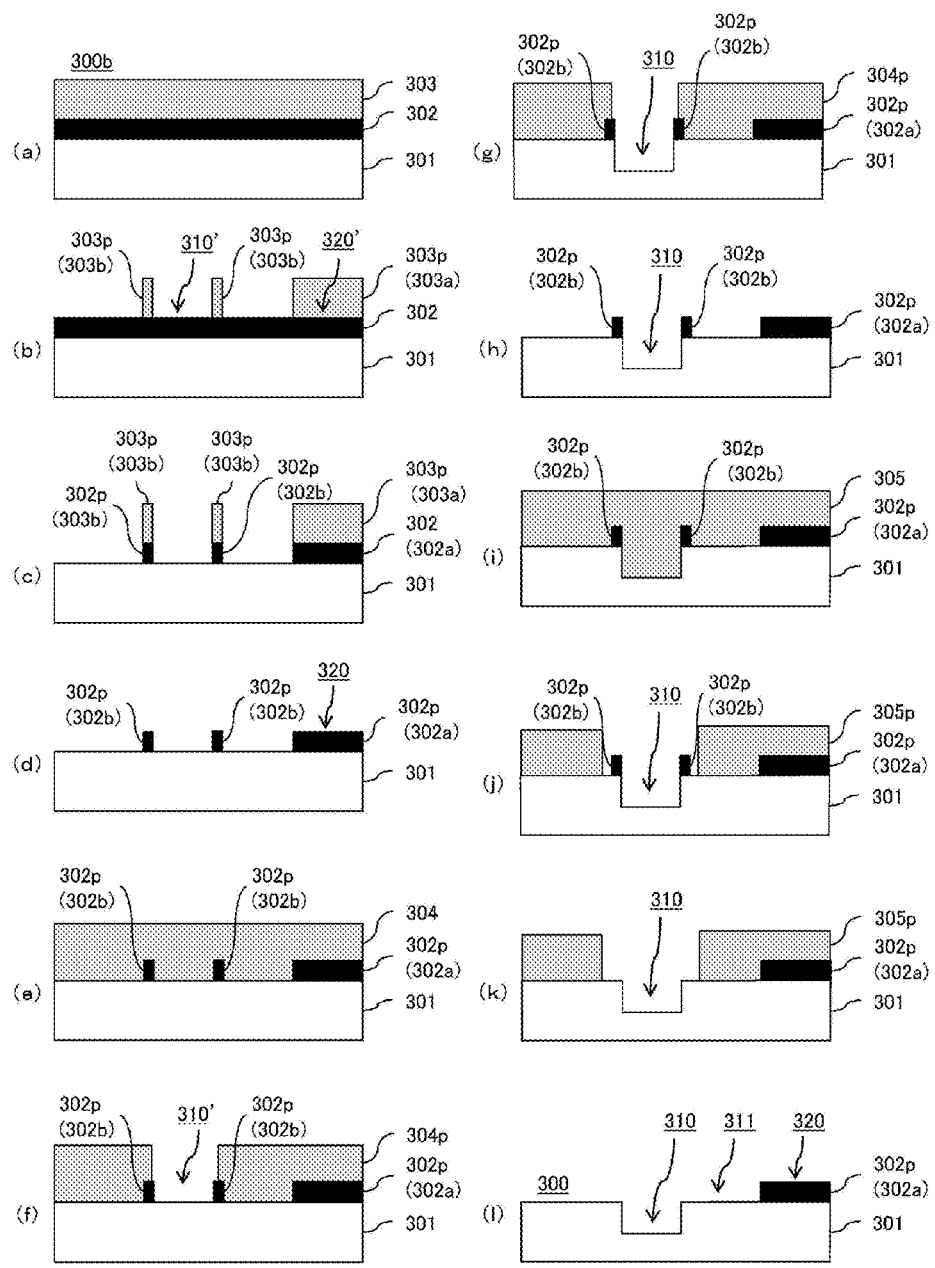
FIG. 3 is a flowchart of the manufacturing method of the optical element according to an embodiment of the present invention.
Figure 6:
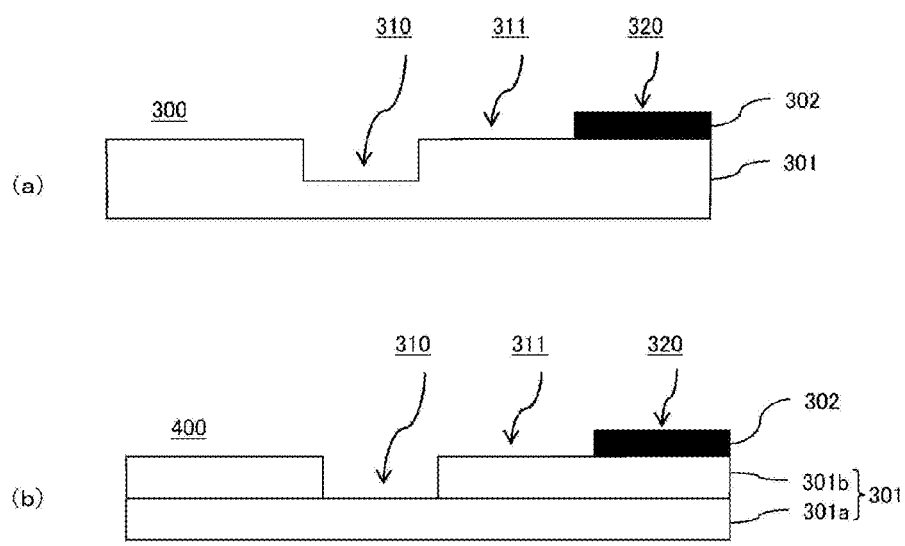
FIG. 6A is a partial sectional view of the optical element according to an embodiment of the present invention.
FIG. 6B is a partial sectional view of the optical element according to other embodiment of the present invention.

An embodiment of the present invention will be described hereafter, mainly with reference to FIG. 3 and FIG. 6A. FIG. 3 is a flowchart of a manufacturing method of an optical element 300 according to this embodiment. FIG. 6A is a partial sectional view of the optical element 300 according to this embodiment.

(1) Structure of the Optical Element

As shown in FIG. 6A, the optical element 300 has a shield part 320 on which a light shielding film 302 formed on a substrate 301 is patterned; a light transmission part 311 formed by partially exposing a surface of the substrate 301; and a phase shifter part 310 formed by partially etching the surface of the substrate 301. Note that FIG. 6A shows a lamination structure of the optical element 300, and an actual pattern is not always the same as that of the optical element 300.

The substrate 301 is formed as a flat plate made of, for example, quartz ($SiO_2$) glass or a low expansion glass containing $SiO_2$, $Al_2O_3$, $B_2O_3$, RO, $R_2O$, etc. A main surface (front surface and rear surface) of the substrate 301 is formed in flatness and smoothly by polishing, etc. The substrate 301 can be formed into a rectangular shape, for example with one side set to about 6 inches. A thickness of the substrate 301 can be set to, for example, about 0.25 inches.

The surface of the substrate 301 is formed, so that etching (dry etching) can be applied thereto by using for example a mixed gas of $CF_4$ and $O_2$ as etching gas. The phase shifter part 310 can be formed by engraving a part of the surface of the substrate 301, in accordance with a phase shift amount supposed to be obtained. For example, in a case of a phase shift mask for ArF, engraving of about 170 nm is achieved, to obtain a phase difference of 180 degrees.

The light shielding film 302 constituting the shield part 320 is substantially mainly composed of chromium (Cr), and is formed by a film forming method such as sputtering. A film thickness of the light shielding film 302 can be set to, for example, about 100 nm. In addition, a layer of a Cr compound (CrO, CrC, and CrN, etc.) is provided on the surface of the light shielding film 302, thereby making it possible to give a reflection inhibiting function to the surface. The light shielding film 302 can be subjected to etching (dry etching) by using, for example, the mixed gas of $Cl_2$ and $O_2$ as etching gas.

As will be describe later, the shield part 320 and the phase shifter part 310 are simultaneously demarcated by performing a drawing step once. A condition of demarcating the shield part 320 and the phase shifter part 310 will be described later. Thus, the relative position between the shield part 320 and the phase shifter part 310 can be set in accordance with the relative position in design. For example, the relative position between the shield part 320 and the phase shifter part 310 can be set within ±5 nm with respect to a design value, and more preferably set to ±3 nm or less. Note that the light transmission part 311 is provided between the shield part 320 and the phase shifter part 310, so that the light transmission part 311 has a portion adjacent to the phase shifter part 310.

Further, preferably light transmissivity of the phase shifter part 310 is approximately equal to the light transmissivity of the light transmission part 311. For example, the light transmissivity of the phase shifter part 310 is set to 80% or more and 100% or less and more preferably 90% or more and 100% or less of the light transmissivity of the light transmission part 311. Note that when the phase shifter part 310 is formed by engraving the substrate 301, the light transmissivity of the phase shifter part 310 is likely to be smaller than the light transmissivity of the light transmission part 311, due to irregular reflection of exposure light of an engraved side face. However, even in this case, it is preferable that the light transmissivity of the phase shifter part 310 is 80% or more of the light transmissivity of the light transmission part 311.

Further, the phase difference between the transmitted light in the light transmission part 311 and the transmitted light in the phase shifter part 310 is set to 45 degrees or more and 200 degrees or less. Note that such a phase difference can be adjusted by selecting an engraving amount of the substrate 301 in the phase shifter part 310.

(2) Manufacturing Method of the Optical Element

Subsequently, the manufacturing method of the optical element 300 according to this embodiment will be described.

(Step of Preparing an Optical Element Blank 300b)

First, as shown in FIG. 3A, an optical element blank 300b with the light shielding film 302 and the first resist film 303 laminated thereon in this order, is prepared. Structures of the substrate 301 and the light shielding film 302 areas follows. The first resist film 303, a second resist film 304 as will be described later, and a third resist film 305 as will be described later, are formed of positive resist materials or negative resist materials. Explanation is given hereafter on the assumption that the first resist film 303, the second resist film 304, and the third resist film 305 are formed of the positive resist materials, respectively. Coating is performed to the first resist film 303, the second resist film 304, and the third resist film 305 by using a method of spin coating or slit coating, and thereafter baked, with its thickness set to, for example, 500 nm or less.

(Step of forming a first resist pattern 303p)

Next, drawing exposure is performed by an electron beam drawing machine and a laser drawing machine, etc, to thereby expose a part of the first resist film 303, then a development liquid is supplied to the first resist film 303 by a method of spray system, etc, to develop this resist film, and a formation scheduled area 320' of the light shielding film 320 is thereby covered and a first resist pattern 303p for demarcating the formation scheduled area 310' of the phase shifter part 310 is formed.

A state of forming the first resist pattern 303p is shown in FIG. 3B. As shown in FIG. 3B, the first resist pattern 303p includes a part 303a covering the formation scheduled area 320' of the shield part 320, and a part 303b for demarcating the formation scheduled area 310' of the phase shifter part 310. The part 303b for demarcating the formation scheduled area 310' of the phase shifter part 310 is formed, so that the formation scheduled area 310' of the phase shifter part 310 is demarcated by covering an outer peripheral side of the formation scheduled area 310' with a prescribed width, while the formation scheduled area 310' of the phase shifter part 310 is exposed.

Figure 5:
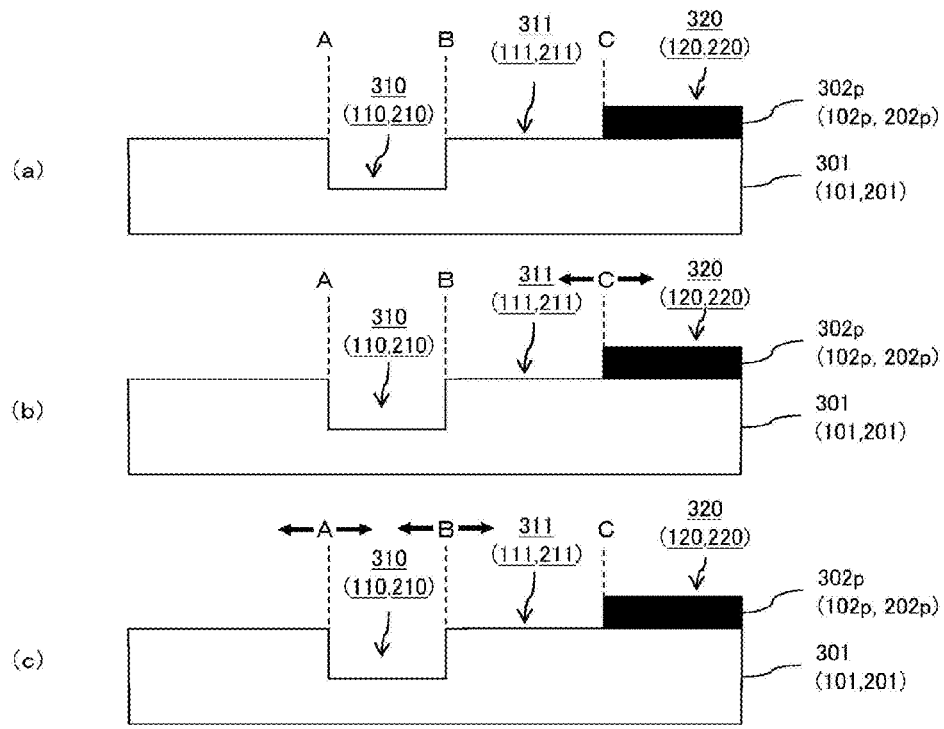
FIG. 5 is a schematic view explaining a demarcation accuracy of the shield part, the light transmission part, and the phase shifter part.

Thus, in this embodiment, by performing the drawing step once, the part 303a covering the formation scheduled area 320' of the shield part 320, and the formation scheduled area 310' of the phase shifter part 310 are simultaneously demarcated. Namely, the formation scheduled area 320' of the shield part 320 and the formation scheduled area 310' of the phase shifter part 310 are simultaneously demarcated by performing the drawing step once. Thus, patterning can be performed while completely excluding alignment deviation of a drawn pattern, which is caused in multiple drawing steps, and the shield part 320, the light transmission part 311, and the phase shifter part 310 can be accurately demarcated. For example, the relative position of the phase shifter part 310 formed with respect to the shield part 320, and the relative position of the phase shifter part 310 in design can be precisely controlled. As a result, as will be described later, a difference between a position on a mask and a position in design (for example, the difference between an actual distance and a design distance of position B and position C in FIG. 5A to FIG. 5C can be set to ±5 nm or less. Further, width and shape (distance between position A and position B in FIG. 5A to FIG. 5C) of the light transmission part 311 formed between the shield part 320 and the phase shifter part 310 can be accurately controlled.

(Step of Etching the Light Shielding Film 302).

Next, the light shielding film 302 is partially etched, with the first resist pattern 303p as a mask, and a light shielding film pattern 302p is formed, to thereby form the shield part 320 and also form a demarcating pattern 302b for demarcating the formation scheduled area 310' of the phase shifter part 310.

A state of partially etching the light shielding film 302 is shown in FIG. 3C. As shown in FIG. 3C, the shielding pattern 302p includes a part 302a for forming the shield part 320, and a demarcating pattern 302b for demarcating the formation scheduled area 310' of the phase shifter part 310. The demarcating pattern 302b is formed so as to demarcate the formation scheduled area 310' of the phase shifter part 310, by covering the outer perihelia side of the formation scheduled area 310' with a prescribed width, while the formation scheduled area 310' of the phase shifter part 310 is exposed.

(Step of Forming a Second Resist Film 304)

Next, the second resist film 304 is formed respectively, for covering at least the formation scheduled area 310' of the phase shifter part 310 and the formation scheduled area 311' of the light transmission part 311 not covered with the demarcating pattern 302b.

A state of forming the second resist film 304 is shown in FIG. 3E. In this embodiment, as shown in FIG. 3D, the second resist film 304 is formed so as to entirely cover an exposed surface of the substrate 301 and an upper surface of the light shielding film pattern 302p (upper surface of the shield part 320 and upper surface of the demarcating pattern 302b).

(Step of Forming the Second Resist Pattern 304p)

Next, the same drawing exposure as described above is performed and a part of the second resist film 304 is exposed and developed, to thereby form a second resist pattern 304p for exposing at least the formation scheduled area 310' of the phase shifter part 310.

A state of forming the second resist pattern 304p is shown in FIG. 3F. Note that in the step of forming the second resist pattern 304p, the formation scheduled area of the phase shifter part 310 is drawn by using drawing data of a large dimension with respect to a dimension of the phase shifter part 310, by alignment margin (for example, 30 nm or less). Thus, the resist pattern is formed so that the formation scheduled area 310' of the phase shifter part 310 is exposed and an edge portion on the side of the formation scheduled area 310' of the phase shifter part 310 in the demarcating pattern 302b is exposed. Thus, when the formation scheduled area 310' of the phase shifter part 310 is etched, an influence of the positional deviation with respect to the second resist pattern and the light shielding film pattern can be prevented, and the etching area is accurately demarcated and also even if the resist pattern is damaged by elapse of etching, an etching shape of the phase shifter part 310 is not influenced thereby. This is because when the phase shifter part 310 is etched, not an edge of the resist pattern but an edge of the demarcating pattern can be used as an edge of the etching mask.

(Step of Forming the Phase Shifter Part 310)

Next, the phase shifter part 310 is formed by partially etching an exposed surface of the substrate 301, with the demarcating pattern 302b and the second resist pattern 304p as masks. Here, the exposed surface of the substrate 301 is etched, with the exposed demarcating pattern 302b (particularly the edge on the side of formation scheduled area 310' of the phase shifter part 310) and the second resist pattern 304p as masks.

Etching of the substrate 301 can be performed by dry etching using mixed gas of $CF_4$ and $O_2$. It is preferable to suitably set a depth of the phase shifter part 310 so as to adjust a phase difference between the transmitted light in the light transmission part 311 and the transmitted light in the phase shifter part 310. A state of forming the phase shifter part 310 is shown in FIG. 3G.

As described above, in the step of forming the second resist pattern 304p, the side of the formation scheduled area 310' (edge potion) of the phase shifter part 310 in the demarcating pattern 302b is partially exposed. Then, in the step of forming the phase shifter part 310, the exposed surface of the substrate 301 is etched, with the demarcating pattern 302b and the second resist pattern 304p as masks.

Here, a sectional shape of the demarcating pattern 302b (light shielding film 302) formed, with substantially chromium (Cr) as a main component, is hardly damaged by etching, etc, compared with the sectional shape of the second resist pattern 304p made of a resist material. Further, the demarcating pattern 302b (light shielding film 302) formed, with substantially chromium (Cr) as a main component, has a high adhesiveness to the surface of the substrate 301 compared with the sectional shape of the second resist pattern 304p made of the resist material. Therefore, an outer edge part (side wall part) of the phase shifter part 310 can be accurately formed by etching the exposed surface of the substrate 301, with the exposed demarcating pattern 302b as a mask.

Further, as described above, in the step of forming the second resist pattern, the edge portion of the side of the formation scheduled area 310' of the phase shifter part 310 in the demarcating pattern 302b is used. Thus, in the step of forming the phase shifter part 310, etching of the substrate 301 can be surely performed, and the shape and depth of the phase shifter part 310 can be accurately controlled.

(Step of Forming the Light Transmission Part 311)

Next, the surface of the substrate 301 is partially exposed by removing the second resist pattern 304b and the demarcating pattern 302b, to thereby form the light transmission part 311.

Specifically, as shown in FIG. 3H, the second resist pattern 304p is removed. Then, as shown in FIG. 3I, a third resist film 305 is formed so as to entirely cover the exposed surface of the substrate 301, the part 302a forming the shield part 320, and the upper surface of the light shielding film pattern (upper surface of the shield part 320 and the upper surface of the demarcating pattern 302b), and the upper surface of the phase shifter part 310.

Then, the same drawing exposure as described above is performed, and a part of the third resist film 305 is exposed and developed, to thereby form a third resist pattern 305p for exposing at least the demarcating pattern 302b and the periphery of the demarcating pattern 302b, as shown in FIG. 3J.

Then, as shown in FIG. 3K, the demarcating pattern 302b is etched and removed. Etching removal of the demarcating pattern 302b can be performed by the same means as means for etching the light shielding film 302. Subsequently, the resist pattern 305p is removed.

As described above, manufacture of the optical element 300 as shown in FIG. 3l is ended.

(3) Effects

According to this embodiment, one or a plurality of effects are exhibited as follows.

(a) According to this embodiment, the part 303a for covering the formation scheduled area 310' of the shield part 320, and the part 303b for demarcating the formation scheduled area 310' of the phase shifter part 310 are simultaneously demarcated by performing the drawing step once. Namely, the formation scheduled area 320' of the shield part 320, and the formation scheduled area 310' of the phase shifter part 310 are simultaneously demarcated by performing the drawing step once. Thus, patterning can be performed, while completely excluding the alignment deviation of the drawing pattern (including a deviation due to accuracy of the drawing machine, and a placement deviation generated every time the substrate is placed in the drawing machine) involved in multiple drawing steps, thus making it possible to accurately demarcate the shield part 320, the light transmission part 311, and the phase shifter part 310. For example, the relative position between the shield part 320 and the phase shifter part 310 can be set within ±5 nm or preferably within ±3 nm with respect to the relative position in design.

Figure 1:
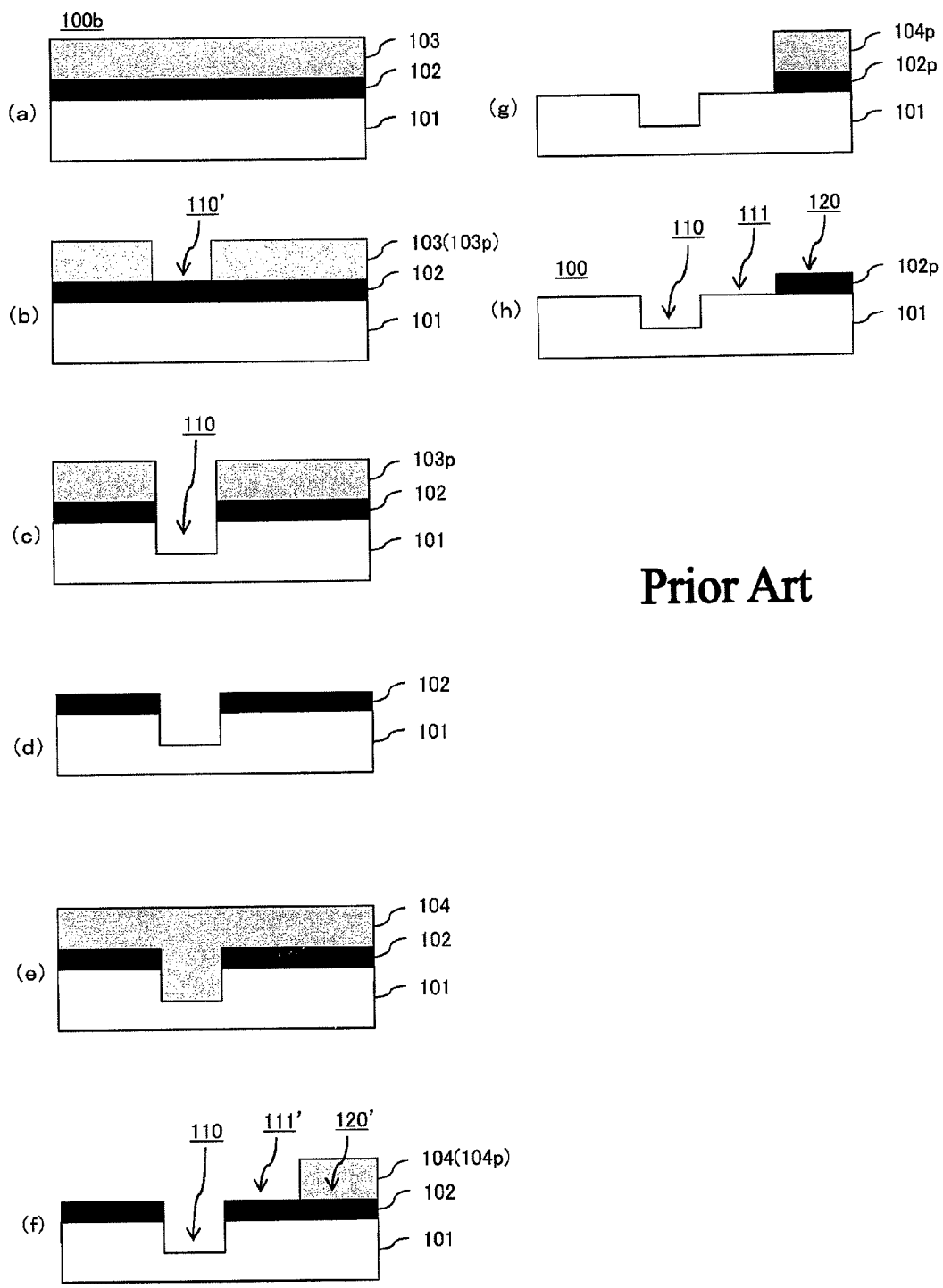
FIG. 1 is a flowchart of a manufacturing method of an optical element according to a reference example for demarcating a shield part, a light transmission part, and a phase shifter part, by undergoing photolithography steps twice.
Figure 2:
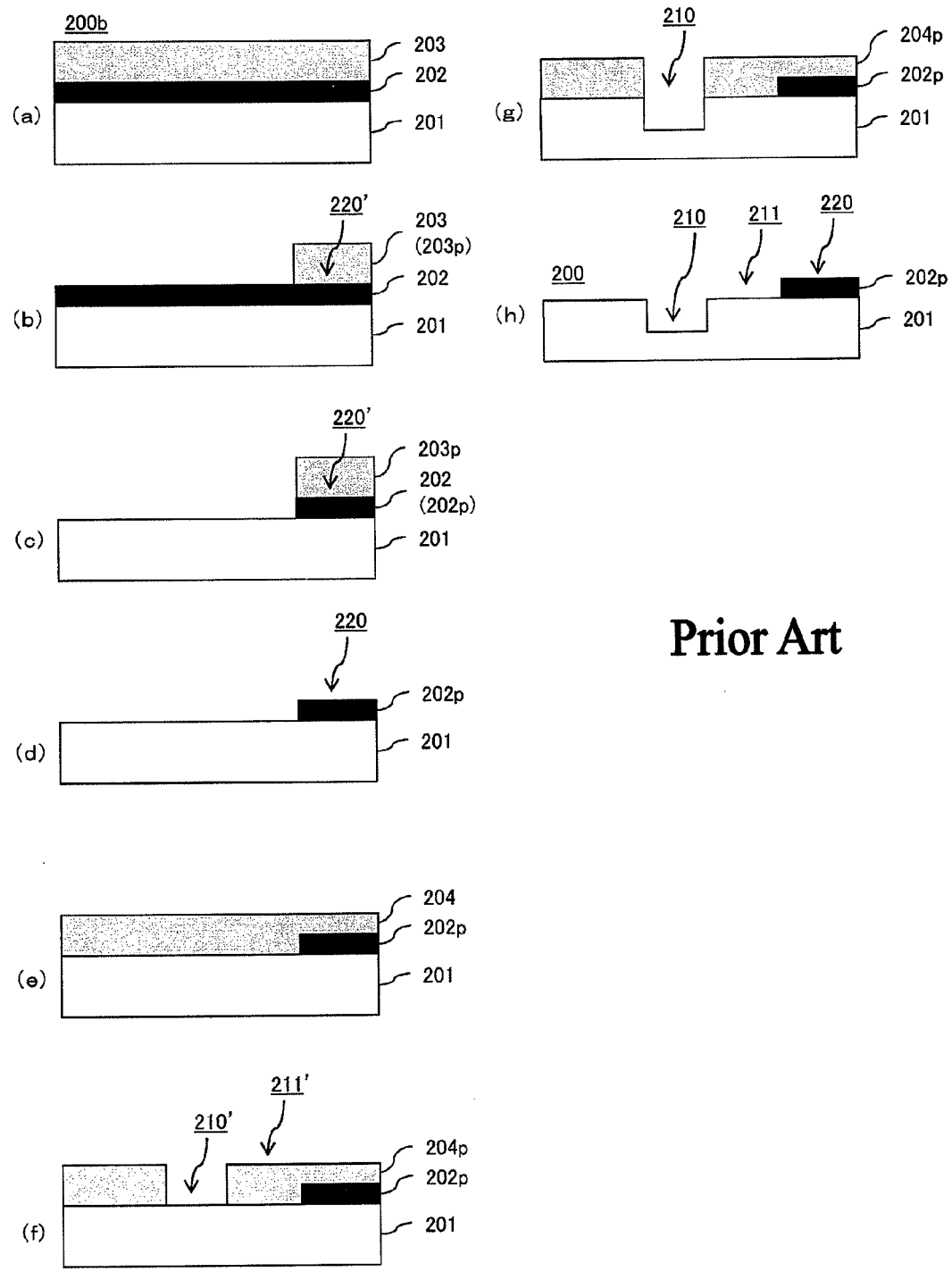
FIG. 2 is a flowchart of the manufacturing method of the optical element according to other reference example for demarcating the shield part, the light transmission part, and the phase shifter part by undergoing photolithography steps twice.

Meanwhile, in the method shown in FIG. 1 and FIG. 2 for demarcating the shield part, the light transmission part, and the phase shifter part by undergoing photolithography steps twice, as described above, for example, the relative position between the shield part and the phase shifter part can not be precisely controlled. This is because, for example, when the mask blank during processing is removed once from the drawing apparatus, it is difficult to install the optical element blank in the drawing apparatus with good reproducibility. Meanwhile, according to this embodiment, the formation scheduled area 320' of the shield part 320, and the formation scheduled area 310' of the phase shifter part 310 are simultaneously demarcated by performing the drawing step once. Therefore, the alignment deviation generated between twice photolithography steps can be solved, and positions of the shield part 320, the light transmission part 311, and the phase shifter part 310 can be accurately demarcated in accordance with a design value.

(b) Further, in the step of forming the second resist pattern 304p according to this embodiment, the edge portion on side of the formation scheduled area 310' of the phase shifter part 310 in the demarcating pattern 302b is exposed. Then, in the step of forming the phase shifter part 310 according to this embodiment, the exposed surface of the substrate 301 is etched, with the demarcating pattern 302b and the second resist pattern 304p as masks. Thus, the outer edge part (side wall part) of the phase shifter part 310 can be accurately formed.

Namely, the sectional shape of the demarcating pattern 302b (light shielding film 302) formed, with substantially chromium (Cr) as a main component, is hardly damaged by etching, etc, compared with the sectional shape of the second resist pattern 304p made of the resist material. In other words, in a case of demarcating an etching area by using the edge of the resists pattern, there is an inconvenience that an edge shape of the resist pattern in the middle of etching is deteriorated. Further, the demarcating pattern 302b (light shielding film 302) formed, with substantially chromium (Cr) as a main component, has high adhesiveness to the surface of the substrate 301, compared with the sectional shape of the second resist pattern 304p made of the resist material. Therefore, the outer edge part (side wall part) of the phase shifter part 310 can be accurately formed by etching the exposed surface of the substrate 301, with the exposed demarcating pattern 302b as a mask.

(c) Further, in the step of forming the second resist pattern according to this embodiment, pattern drawing is performed by using pattern data with greater dimension than the dimension of the phase shifter part 310 by a portion of considering an alignment margin, so that the edge portion on the side of the formation scheduled area 310' of the phase shifter part 310 in the demarcating pattern 302b is partially exposed. Thus, residual of the second resist film 304 in the formation scheduled area 310' of the phase shifter part 310 can be surely prevented. Thus, etching of the substrate 301 can be surely performed, and the shape and depth of the phase shifter part 310 can be accurately controlled.

(d) Further, the optical element 300 according to this embodiment can be used as a phase shift mask for transferring a prescribed transfer pattern onto a transformed body by utilizing a phase shift effect.

Specifically, the optical element 300, being the phase shift mask, is installed in a projection optical system, to perform exposure to a photoreceptor on the transferred body, and transfer images of a plurality of arrayed shield parts 320 onto the photoreceptor. Here, as described above, the light transmissivity of the phase shifter part 310 is set to 80% or more and 100% or less of the light transmissivity of the light transmission part 311, and therefore the transferred body can be irradiated with the exposure light of a necessary quantity. Further, the light transmission part 311 has a portion adjacent to the phase shifter part 310. However, the phase difference between the transmitted light in the light transmission part 311 and the transmitted light in the phase shifter part 310 is set to 45 degrees or more and 200 degrees or less, or more preferably set to 160 to 200°, and therefore inversion of the exposure light in a border area between the light transmission part 311 and the phase shifter part 310 is generated, thus making it possible to improve contrast of light intensity. Note that i-ray (365 nm), KrF excimer laser (248 nm), or ArF excimer laser (193 nm), etc, can be used to obtain the exposure light.

Further, the relative position between the shield part 320 and the phase shifter part 310 can be set within ±5 nm or preferably within ±3 nm with respect to the relative position in design, and therefore a prescribed transfer pattern can be precisely transferred onto the transferred body.

(e) Further, an element in which a plurality of optical elements 300 of this embodiment are arrayed (element in which the phase shifter part 310 and the shield part 320 are adjacent to each other, with the light transmission part 311 therebetween, and this structure is arrayed at intervals) can be used as a focus monitor for obtaining a best focus position of an exposure apparatus by utilizing the phase shift effect. Namely, when the transfer pattern formed on a photomask is transferred to the transferred body, the photomask needs to be disposed within a range of a focal depth from a best focus surface of the projection optical system provided to the exposure apparatus. However, it is not easy to obtain the best focus position of the projection optical system. Meanwhile, if the focus monitor is used in which a plurality of optical elements 300 shown in FIG. 6A are arrayed, the best focus surface of the projection optical system can be easily obtained. In this case, the phase difference from the transmitted light in the phase shifter part 310 can be set to, for example, 45 degrees or more and 135 degrees or less.

Specifically, the focus monitor in which a plurality of optical elements 300 are arrayed, is installed in the projection optical system, and exposure is performed to the photoreceptor on the transferred body, to thereby transfer the images of arrayed plurality of light shielding parts 320 onto the photoreceptor. Here, as described above, the phase difference between the transmitted light in the light transmission part 311 and the transmitted light in the phase shifter part 310 is set to 45 degrees or more and 135 degrees or less. Therefore, if the focus monitor is disposed at a position deviated from the best focus position (when defocusing is generated), the image of the light shielding part 320 is moved in accordance with a deviation amount (interval of the image of the shield part 320 is changed). Namely, the best focus position can be easily calculated by examining a moving amount of the image of the shield part 320 (change amount of the interval of the images of the shield parts 320). Further, the relative position between the shield part 320 and the phase shift part 310 can be set within ±5 nm, or preferably within ±3 nm with respect to the relative position in design, and therefore the best focus position can be accurately calculated.

<Other Embodiment of the Present Invention>

Figure 4:
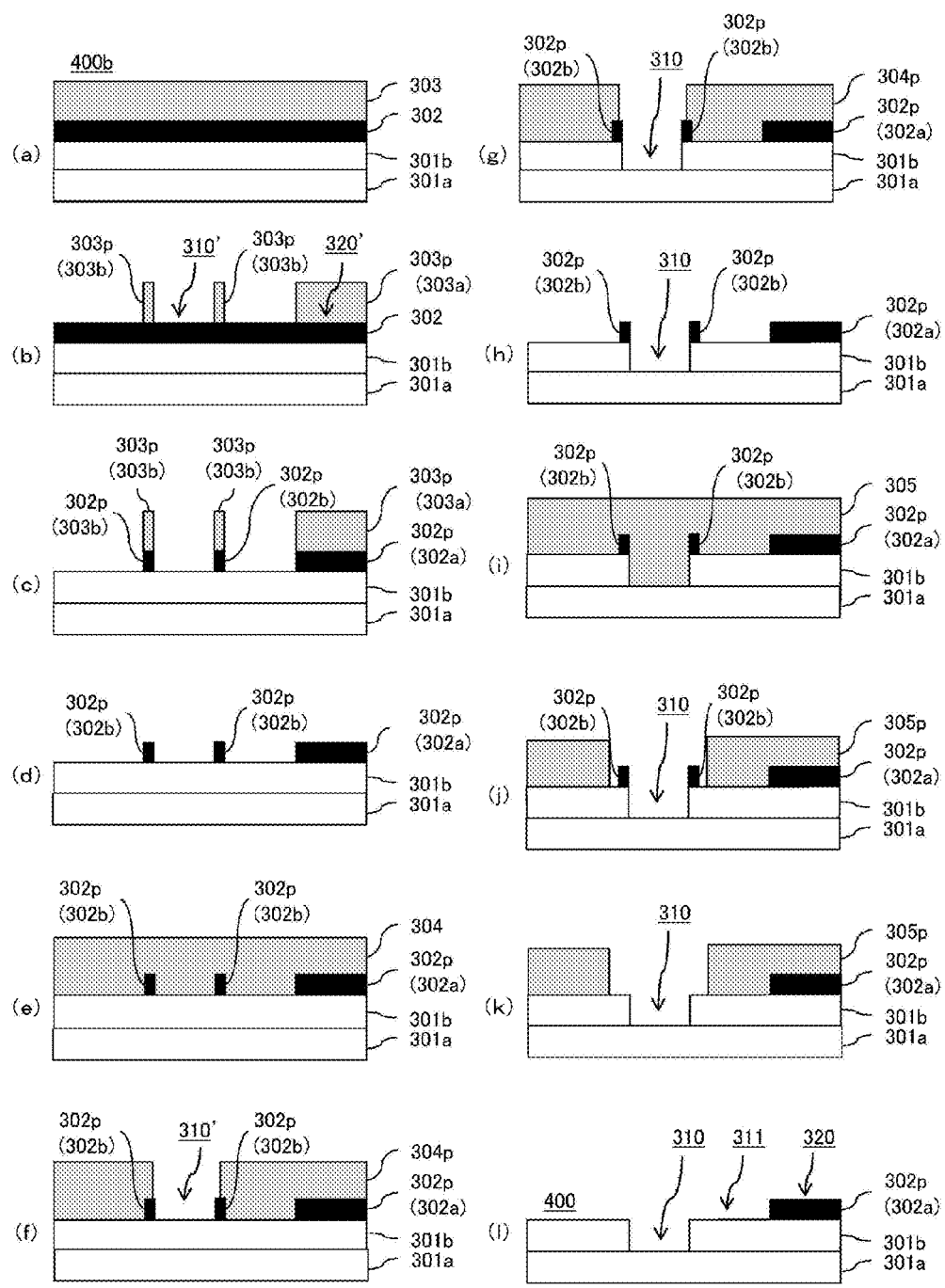
FIG. 4 is a flowchart of the manufacturing method of the optical element according to other embodiment of the present invention.

Subsequently, other embodiments of the present invention will be described, with reference to mainly FIG. 4 and FIG. 6B. FIG. 4 is a flowchart of a manufacturing method of an optical element 400 according to this embodiment. FIG. 6B is a partial sectional view of the optical element 400 according to this embodiment.

As shown in FIG. 6B, in this embodiment, a different point from the aforementioned embodiment is that the substrate 301 includes a transparent base material 301a and a phase shifter film 301b formed on the transparent base material 301a.

Further, as shown in FIG. 4, in this embodiment, in the step of forming the phase shifter part 310 (shown in FIG. 4G), a different point from the aforementioned embodiment is that the exposed surface of the phase shifter film 301b is etched, with the demarcating pattern 302b and the second resist pattern 304p as masks. Namely, the phase shifter part 310 is formed by etching the phase shifter film 301b. Moreover, the light transmission part 311 is formed by exposing the surface of the phase shifter film 301b without being etched.

As the phase shifter film 301b, for example, SiO$_2$ (sputter SiO$_2$, CVDSiO$_2$, TEOS-SiO$_2$) can be given used for the phase shifter other than halftone, and MoSi compound, Cr compound (the compound means oxide, nitride, carbide, and mixture thereof), Ta compound, and SOG (spin-on glass) can be given used for a halftone type phase shifter, and the phase shifter film 301b can be formed thereby.

A desired phase shift amount can be provided by the phase shifter film 301b, by selection and film thickness of the material. For example, phase shift of 160 to 200 degrees can be provided. Note that preferably the light transmissivity of the phase shifter part 310 and the light transmissivity of the light transmission part 311 are set to approximately the same values. However, the light transmissivity of the phase shifter part 310 becomes smaller than the light transmissivity of the light transmission part 311 in some cases, depending on the transmissivity of the phase shifter film 301b. In this case as well, the material, etc, of the phase shifter film 301b is preferably selected so that the light transmissivity of the phase shifter part 310 is set to 80% or more of the light transmissivity of the light transmission part 311. Further, when the phase shifter film 301b is a halftone film, exposure light transmissivity of the phase shifter film is preferably set to 5 to 30%.

The other points are the same as the aforementioned embodiment.

In this embodiment as well, the same effects as those of the aforementioned embodiment can be exhibited. Thus, a shield band of the phase shift mask (portion disposed outside an area of the transfer pattern to be transferred, for shielding the light so that unnecessary light does not reach the transferred body during exposure) can be precisely positioned with respect to the transfer pattern.

Further, when the transparent base material 301a has resistance properties to etching liquid or etching gas used for etching the phase shifter film 301b, namely when the transparent base material 301a functions as an etching stopper for etching the phase shifter film 301b, the depth of the phase shifter part 310 can be accurately controlled. As a result, the phase difference between the transmitted light in the light transmission part 311 and the transmitted light in the phase shifter part 310 can be accurately controlled. Meanwhile, when the phase shifter film is formed by using the material that can not sufficiently obtaining the resistance properties of the transparent base material 301a, an etching stopper film can be interposed between the transparent base material and the phase shifter film.

<Further Other Embodiment of the Present Invention>

As described above, the embodiments of the present invention are described specifically. However, the present invention is not limited to the aforementioned embodiments, and the present invention can be variously modified in a range not departing from the gist thereof.

For example, the optical element according to the present invention can be applied not only as the phase shift mask for transferring a prescribed transferred pattern onto the transferred body or the focus monitor for obtaining the best focus position of the exposure apparatus, but also to other element utilizing the phase shift effect.

In addition, the present invention is particularly effective to the optical element having a pattern in which the light transmission part has a portion adjacent to the phase shifter part. Originally, in such a pattern, a shield film pattern that functions for demarcating a border does not exist on the border, and therefore the outer edge of the pattern is hardly demarcated by using an end portion (edge) of a shielding pattern. However, by suing the demarcating pattern according to the aforementioned embodiment, the light shielding pattern can be provisionally provided to the border part, and dimension accuracy and position accuracy of the pattern can be increased.

What is claimed is:

1. A manufacturing method of an optical element, said optical element comprising:

a light shielding part formed by a light shielding film formed and patterned on a substrate;

a light transmission part formed by partially exposing a surface of the substrate; and a phase shifter part formed by partially etching the surface of the substrate, said phase shifter part having a portion adjacent to the light transmission part, said method comprising the steps of:

preparing an optical element blank having the light shielding film and a first resist film laminated on the substrate;

forming a first resist pattern by applying drawing and development to the first resist film, said first resist pattern covering an area for the light shielding part and for, in the area for the light transmission part, forming a bordering pattern which borders an area for the phase shifter part, etching the light shielding film with the first resist pattern as a mask to form the light shielding part and the bordering pattern, forming a second resist pattern by applying drawing and development to a second resist film, said second resist pattern exposes the substrate in an area for the phase shifter part, etching the exposed substrate to form the phase shifter part with the second resist pattern and the bordering pattern as masks, and forming the light transmission part by removing the second resist pattern and the bordering pattern.

2. The manufacturing method of the optical element according to claim 1, wherein the bordering pattern borders the area for the phase shifter part by covering an outer peripheral side of the area for the phase shifter part.

3. The manufacturing method of the optical element according to claim 1, wherein the substrate is a transparent base material made of quartz.

4. The manufacturing method of the optical element according to claim 1, wherein a difference between a phase of transmitted light in the light transmission part and a phase of transmitted light in the phase shifter part is 45 degrees or more and 200 degrees or less.

5. The manufacturing method of the optical element according to claim 1, wherein a relative position of the light transmission part with respect to the phase shifter part is within ±5 nm of design tolerance.

6. The manufacturing method of the optical element according to claim 1, wherein the substrate includes a transparent base material and a phase shifter film formed on the transparent base material, and in the step of forming the phase shifter part, an exposed surface of the phase shifter film is etched, with the bordering pattern and the second resist pattern as mask.

7. The manufacturing method of the optical element according to claim 1, wherein the second resist pattern is formed by applying a pattern data having a dimension of the phase shifter part with an addition of a margin, so that the second resist pattern exposes the substrate in the area for the phase shifter part and an edge of the bordering pattern on the side of the area for the phase shifter part.

8. The manufacturing method of the optical element according to claim 7, wherein the second resist pattern and the edge of the bordering pattern on the side of the area for phase shifter part are used as mask in etching the exposed substrate in forming the shifter part.

* * * * *